(12) United States Patent
Eichler et al.

(10) Patent No.: US 10,855,228 B2
(45) Date of Patent: Dec. 1, 2020

(54) VOLTAGE REGULATION SYSTEMS AND METHODS WITH ADJUSTABLE BOOST AND STEP-DOWN REGULATION

(71) Applicant: Intel Corporation, Santa Clara, CA (US)

(72) Inventors: Thomas Eichler, Neubiberg (DE); Stephan Henzler, Munich (DE)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 16/369,516

(22) Filed: Mar. 29, 2019

(65) Prior Publication Data

US 2020/0313622 A1 Oct. 1, 2020

(51) Int. Cl.
*H03G 3/20* (2006.01)
*H03F 1/02* (2006.01)
*H02M 3/158* (2006.01)
*H03F 3/21* (2006.01)
*H03F 3/195* (2006.01)

(52) U.S. Cl.
CPC ........ *H03F 1/0227* (2013.01); *H02M 3/1582* (2013.01); *H03F 3/195* (2013.01); *H03F 3/211* (2013.01)

(58) Field of Classification Search
CPC .................................. H03G 3/20; H03F 1/30
USPC .................................................. 330/129, 297
See application file for complete search history.

(56) References Cited

U.S. PATENT DOCUMENTS

| | | | |
|---|---|---|---|
| 6,914,487 B1 * | 7/2005 | Doyle | H03F 1/0222 330/129 |
| 8,687,826 B2 * | 4/2014 | Lesso | H03F 1/0216 381/120 |

(Continued)

FOREIGN PATENT DOCUMENTS

| | | |
|---|---|---|
| WO | 2015/123267 A1 | 8/2015 |
| WO | 2018/182880 A1 | 10/2018 |

OTHER PUBLICATIONS

Rodriguez, Miguel et al. "A Multiple-Input Digitally Controlled Buck Converter for Envelope Tracking Applications in Radiofrequency Power Amplifiers." IEEE Transactions on Power Electronics, vol. 25, No. 2, Feb. 2010. 13 pages.

(Continued)

*Primary Examiner* — Henry Choe
(74) *Attorney, Agent, or Firm* — Schiff Hardin LLP

(57) ABSTRACT

Systems, methods, and circuitries are provided for generating supply voltages for a power amplifier in a digital envelope tracking system. In one example, a voltage generation circuitry converts a source voltage into a supply voltage based on a target voltage. The voltage regulation circuitry includes an adjustable boost circuitry that multiplies the source voltage to generate an input voltage having a voltage equal to or greater than the source voltage and a step-down regulator circuitry that regulates the input voltage to generate a regulated output voltage having a voltage that is less than or equal to the input voltage. A voltage splitter circuitry is coupled to the regulated output voltage and is configured to generate at least one derived output voltage from the regulated output voltage. A supply modulator provides a selected one of the at least one derived output voltage to a power amplifier.

22 Claims, 5 Drawing Sheets

(56) References Cited

U.S. PATENT DOCUMENTS

| | | | |
|---|---|---|---|
| 8,718,188 B2* | 5/2014 | Balteanu | H03F 1/02 |
| | | | 375/297 |
| 8,981,846 B2* | 3/2015 | Wimpenny | H03F 1/0266 |
| | | | 330/136 |
| 8,981,847 B2 | 3/2015 | Balteanu | |
| 2008/0297246 A1* | 12/2008 | Taylor | H03F 1/0216 |
| | | | 330/136 |
| 2009/0191826 A1 | 7/2009 | Takinami et al. | |
| 2013/0193943 A1 | 8/2013 | Wilson | |
| 2013/0321085 A1* | 12/2013 | Fagg | H03F 1/0222 |
| | | | 330/296 |
| 2014/0062590 A1 | 3/2014 | Khlat et al. | |
| 2014/0312710 A1 | 10/2014 | Li | |
| 2020/0153393 A1* | 5/2020 | Orr | G05F 1/575 |

OTHER PUBLICATIONS

Search Report dated May 20, 2020 for International Application No. PCT/US2020/016046.

* cited by examiner

VOLTAGE REGULATION SYSTEMS AND METHODS WITH ADJUSTABLE BOOST AND STEP-DOWN REGULATION

BACKGROUND

Envelope tracking is a technique by which the bias or supply voltage (e.g., $V_{CC}$) and current of a power amplifier (PA) in a transmit chain is controlled based on the RF signal envelope of the transmit signal being amplified by the power amplifier. The idea is to operate the power amplifier close to or slightly in compression and to lower the PA supply voltage when the instantaneous signal amplitude is low, thereby boosting the efficiency of the power amplifier and its supply generation.

BRIEF DESCRIPTION OF THE DRAWINGS

Some examples of circuits, apparatuses and/or methods will be described in the following by way of example only. In this context, reference will be made to the accompanying figures.

DESCRIPTION

Some transmitters that employ envelope tracking techniques generate the supply voltage for the power amplifier using an analog control loop. Within the loop, the power amplifier supply voltage is sensed, compared to a target voltage that tracks the envelope of the signal being amplified, and the difference is used to steer a continuous actuator such as an amplifier to correct the power amplifier supply voltage. This analog-based envelope tracking solution suffers from several problems. For example, the realization of the analog control loop becomes difficult for increasing envelope signal bandwidth while maintaining reasonable system efficiency. Further, the alternating current (AC) signal path used to generate and control the supply voltage to be equal to the target voltage and the direct current (DC) signal path used to determine the target voltage are normally separated into two supply chains, which yields an unattractively large solution area on the printed circuit board (PCB). The analog control loop for supply voltage control is feasible for 2× or possibly 3× carrier aggregation in the cellular context. For higher levels of carrier aggregation in cellular applications and for WLAN/WiFi applications, the analog control loop solution does not scale.

Figure 1:
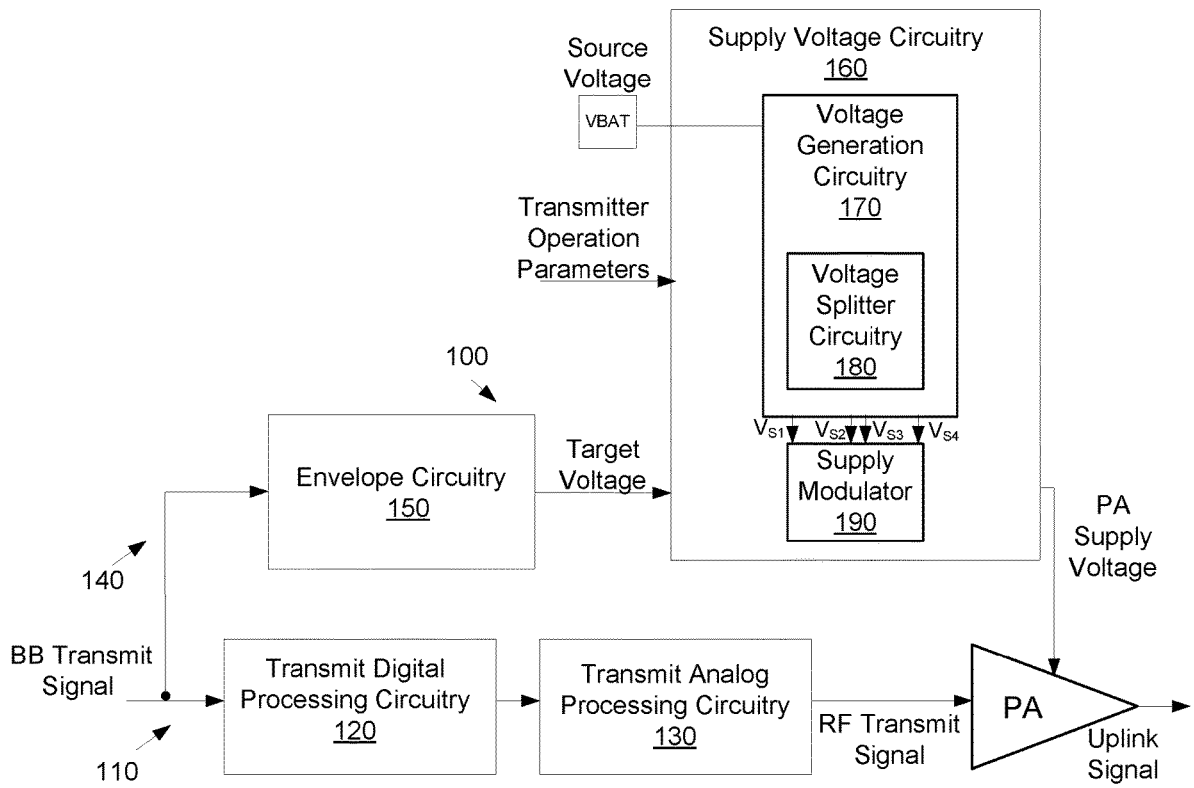
FIG. 1 illustrates an exemplary transmitter architecture that includes a supply voltage circuitry that supplies voltage to a power amplifier.

FIG. 1 illustrates an exemplary transmitter architecture 100 that includes a transmitter chain 110 and an exemplary envelope tracking system 140. The transmitter chain 110 processes a digital baseband transmit signal to generate a radio frequency (RF) transmit signal. The RF transmit signal is amplified by a PA to generate an uplink signal that is transmitted by an antenna or cable (not shown). The exemplary transmit chain 110 includes transmit digital processing circuitry 120, which operates on a digital baseband transmit signal to convert the signal into amplitude and phase components. The amplitude and phase components are converted into the analog RF transmit signal by transmit analog processing circuitry 130.

Figure 1A:
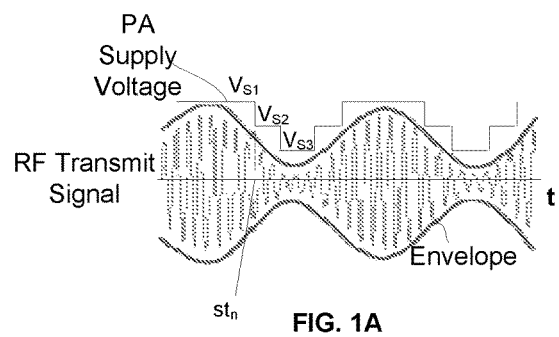
FIG. 1A illustrates an exemplary radio frequency (RF) transmit signal, an envelope of the RF transmit signal, and a PA supply voltage provided to the PA from the supply voltage circuitry of FIG. 1.

The envelope tracking system 140 includes envelope circuitry 150 to generate a target voltage signal, which is used to control a supply voltage circuitry 160 to supply a selected supply voltage to the PA. The envelope circuitry 150 samples the baseband transmit signal to project an envelope of the RF transmit signal that will be amplified by the PA to generate the uplink signal. FIG. 1A illustrates an exemplary RF transmit signal and an envelope that bounds the RF transmit signal. The envelope circuitry 150 determines the envelope of the RF transmit signal and generates the target voltage signal to control the supply voltage circuitry 160 to provide a PA supply voltage that closely matches the envelope.

The target voltage signal generated by the envelope circuitry includes voltage domain information that may be a control word or voltage that communicates the desired supply voltage or a selection setting from the plurality of voltage levels to the supply voltage circuitry 160. In addition, the target voltage signal may include time domain information that communicates a time during which the desired supply voltage should be provided to the PA. For example, the target voltage signal may specify voltage domain information $V_{S2}$ and time domain information $st_n$ to cause the supply voltage circuitry 160 to change the PA supply voltage from $V_{S1}$ to $V_{S2}$ at the switching time $st_n$ as shown in FIG. 1A. The time domain information may also include a duration of time until a next voltage level and switching time will be communicated.

In order to reduce noise, the envelope circuitry 150 may determine a switching time that will coincide with a relative low RF transmit signal (e.g., when the RF transmit signal is crossing the frequency axis as shown in FIG. 1A). In one example, "relative low" means that the RF transmit signal is lower or equal to a predetermined threshold. In an alternate implementation the envelope circuitry 150 may choose a switching time when the instantaneous envelope signal is low, i.e., when the instantaneous signal power is low. In this case the next selected voltage is an upper bound of all instantaneous target voltages which occur until another low phase is reached. At the next low phase another voltage is selected and so on. Thus the switching time may be selected based on either a zero crossing of the RF signal or a close to zero condition of the envelope signal.

The supply voltage circuitry 160 includes voltage generation circuitry 170 and supply modulator 190. The principle of the supply voltage circuitry 160 is to remove the analog control loop of prior envelope tracking systems and instead generate the PA supply voltage in a feed-forward manner. The voltage generation circuitry 170 is an analog circuit that generates a regulated output voltage from the battery voltage VBAT. The voltage generation circuitry 170 includes a voltage splitter circuitry 180, which may be a switched capacitor network or charge pump (see FIG. 3), that generates a plurality of output voltages having differing levels from the regulated output voltage. The supply modulator 190 is a switching circuit that connects one of these output voltages to the output of the supply voltage circuitry 160. The output of the supply voltage circuitry 160 is connected to a supply input (not shown) of the PA.

It can be seen in FIG. 1A that the PA supply voltage provided by the supply voltage circuitry 160 varies in a stepwise fashion to approximate the envelope. While analog envelope tracking PA power supply solutions may also be able to closely follow the envelope, recall that analog solutions have limited applicability in high frequency applications and present the other drawbacks discussed above. The feed forward envelope tracking described herein provides effective envelope tracking in a manner that scales for higher frequencies and presents a small package size.

The voltage supply circuitry 160 is capable of producing any number of voltage levels. To leverage this feature the supply voltage circuitry 160 inputs transmitter operation parameters that include, for example, a transmit power level and mode of operation. The supply voltage circuitry 160 may use this information to control or scale the voltage levels are produced by the supply voltage circuitry 160. For example, if the transmit power level is relatively small, the set of voltages may span a smaller range so that the PA supply voltage can more closely follow the envelope or the number of voltages may be reduced to a smaller set. In contrast, if the transmit power level is large, the set of voltages may span a larger range to cover the variation in the envelope.

It can be seen in FIG. 1 that the there is no control loop in the generation of the PA supply voltage. The output PA supply voltage is delivered from pure voltage sources instead of a regulated stage. Thus the PA supply voltage may be more accurate and less load dependent especially at high frequencies and during fast switching. Fast switching multiplexers or other switches are available to be used for the supply modulator 190. This is advantageous because the higher signal bandwidths of modern devices translate into a need for faster switching between the different voltage levels. The fast switching provided by the supply modulator 190 thus fits well to modern, digital dominated technologies. The illustrated supply voltage circuitry 160 separates the analog task of voltage level generation from the control of voltage selection, which is digital.

Figure 1B:
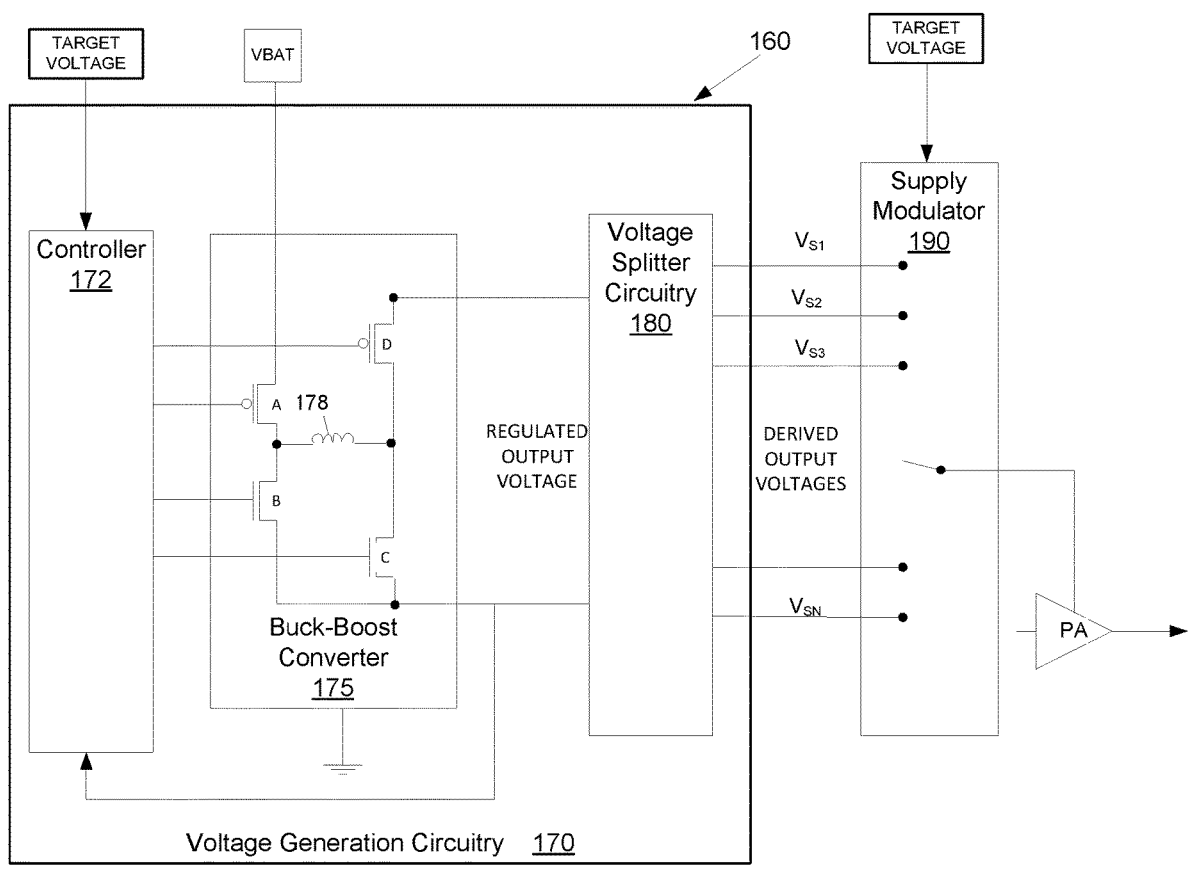
FIG. 1B illustrates an exemplary transmitter architecture that includes a buck-boost converter as part of the supply voltage circuitry.

FIG. 1B illustrates the voltage supply system 160 of FIG. 1 with a more detailed view of a voltage generation circuitry 170. The voltage generation circuitry 170 includes a controller 172 and a buck-boost DC/DC converter 175 which is coupled to the voltage splitter circuitry 180. The buck-boost converter 175 includes a coil 178 having a coil current that is selectively controlled by a set of buck-boost switches (denoted as devices A-D). While particular types of devices (e.g., NMOS, PMOS) are illustrated other devices and configurations for the buck-boost switches may be used. The buck-boost converter 175 operates in either a buck mode or a boost mode. While in either mode, the buck-boost switches are controlled to either charge the coil 178 with the supply voltage or discharge the coil.

The controller 172 is configured to determine a target coil current based on a difference between the target voltage and the regulated output voltage of the buck-boost converter 175. The controller 172 compares the target coil current to a current in the coil 178. When coil current reaches the target current, based on the difference between the target voltage and the regulated output voltage, the controller 172 generates either a "charge" control signal or a "discharge" control signal. Depending on whether the controller 172 is in buck mode or boost mode, the charge and discharge control signals will operate the buck-boost switches differently.

For example, in the example of FIG. 1B, in buck mode, the charge control signal will switch device A ON and OFF based on some switching protocol, switch devices B and C to OFF, and switch device D to ON. In buck mode the discharge control signal will switch device A to OFF, switch device B ON and OFF based on the switching protocol, switch device C to OFF, and switch device D to ON. In boost mode the charge control signal will switch device A to ON, switch device B to OFF, switch device C ON and OFF based on the switching protocol, and switch device D to OFF. In boost mode the discharge control signal will switch device A to ON, switch devices B and C to OFF, and switch device D ON and OFF based on the switching protocol.

New telecommunication standards like 5G New Radio (NR) have further increased output power requirements for RF power management integrated circuits (ICs) such as envelope trackers and also output power requirements for regular average power tracking (APT) power management ICs. Currently the standards require an output current of up to 2.5 A at a voltage level of 5.5V supplying the power amplifier. This power also needs to be delivered at low battery voltages, (e.g., approximately 3.0V) which means that the battery voltage is often boosted. A disadvantage of using the buck-boost converter 175 to boost the battery voltage is that the high peak current occurring in the coil 178 will reach about 2 times the output current. In this example, this means there will be a 5 A peak current in the coil. Coils which are able to handle this current have a significant volume which consumes board space and, even more importantly, significantly impacts the height of the transmitter device.

Described herein are systems, circuitries, and methods that utilize an adjustable boost circuitry that does not rely on an inductor to boost the battery voltage and a step-down regulator circuitry that includes an inductor to regulate the boosted battery voltage in a buck mode. The adjustable boost circuitry may be a capacitive charge pump, meaning that the relatively high energy density of capacitors may be leveraged. The step-down regulator may be an inductive buck DC/DC converter that has a significantly smaller coil than would be needed if the DC/DC converter was used to boost the battery voltage.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring to the transmit signal in baseband, intermediate, and radio frequencies.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

Figure 2:
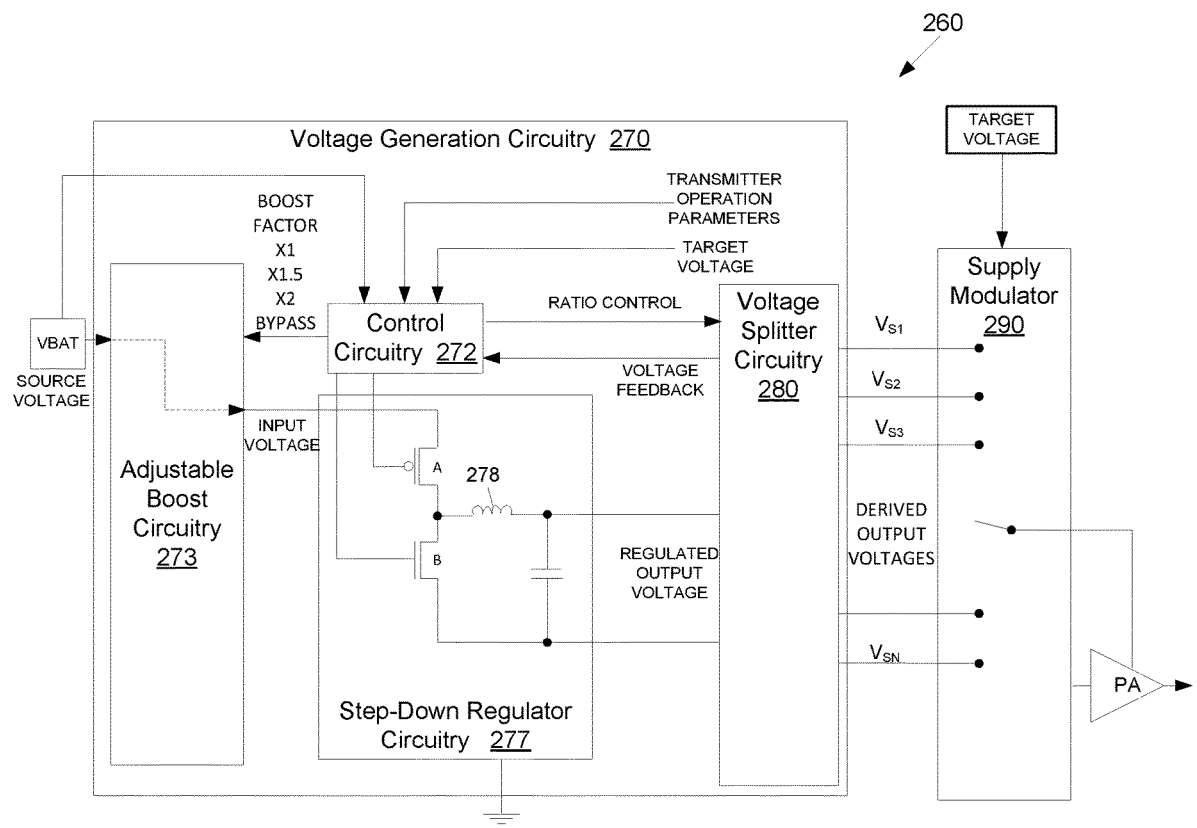
FIG. 2 illustrates an exemplary transmitter that includes adjustable boost and step-down regulator circuitries in the supply voltage circuitry in accordance with various aspects described.

FIG. 2 illustrates an exemplary supply voltage circuitry 260 configured to provide a regulated output voltage to a power amplifier according to an envelope tracking scheme. The supply voltage circuitry 260 includes a voltage generation circuitry 270 configured to convert a source voltage (e.g., battery voltage) to a regulated output voltage based on a target voltage that is determined for envelope tracking purposes. The voltage generation circuitry 270 includes an adjustable boost circuitry 273 and a step-down regulator circuitry 277. The adjustable boost circuitry 273 is configured to multiply the source voltage to generate an input voltage having a voltage equal to or greater than the source voltage. The step-down regulator circuitry 277 is configured to regulate the input voltage to generate a regulated output voltage having a voltage that is less than or equal to the input voltage.

Depending on voltage feedback from a voltage splitter circuitry 280 as compared to the target voltage, the adjustable boost circuitry 273 may boost the source voltage by a selectable boost factor to an input voltage that is equal to or slightly greater than the target voltage. The step-down converter 277 regulates the input voltage "down" to the regulated output voltage. The voltage generation circuitry 270 supplies the regulated output voltage to the voltage splitter circuitry 280 which generates at least one derived output voltage from the regulated output voltage. A supply modulator 290 selects one of the derived output voltages based on a target voltage and provides the selected output voltage to a power amplifier (PA).

In one example, the adjustable boost circuitry 273 includes a capacitor-based adjustable charge pump that multiplies a charge level of the source voltage by the boost factor to generate the input voltage. In other examples, other charge boosting circuits may be used to embody the adjustable boost circuitry 273. In one example, the step-down regulator circuitry 277 includes DC/DC buck converter as shown in FIG. 2. Other step-down regulator circuitries can be used.

Control circuitry 272 is configured to determine the target voltage and select a boost factor (X1, X1.5, and X2 are illustrated, different boost factors may be used) for the adjustable boost circuitry 273 based on the target voltage and the source voltage. The control circuitry 272 also generates control signals (e.g., charge and discharge control signals) for the step-down regulator circuitry 277 based on a difference between the target voltage and a voltage feedback signal from the voltage splitter circuitry 280.

When the target voltage is less than or equal to the source voltage, the control circuitry 272 is configured to operate the adjustable boost pump 273 in a bypass mode (shown in dashed lines) such that the source voltage is input directly to the step-down regulator circuitry 277 as the input voltage. In one example, the step-down regulator circuitry 277 includes a DC/DC buck converter having a single inductor with a maximum current rating approximately equal to a current that is drawn by the PA when a maximum regulated output voltage is provided to the PA.

In one example, the control circuitry 272 determines a ratio control signal that defines a ratio between the regulated output voltage and the derived output voltages. The control circuitry 272 determines the ratio based on transmitter operation parameters that can be used to determine a range of desired derived output voltages or indicate that the transmitter is in a power saving mode. The control circuitry 272 can use the ratio to scale the maximum derived output voltage (as well as the other derived output voltages) to be less than the regulated output voltage by some factor. The control circuitry 272 provides the ratio control circuitry to the voltage splitter circuitry 280 to control the voltage level of the various derived output voltages as a proportion of the regulated output voltage.

Figure 3:
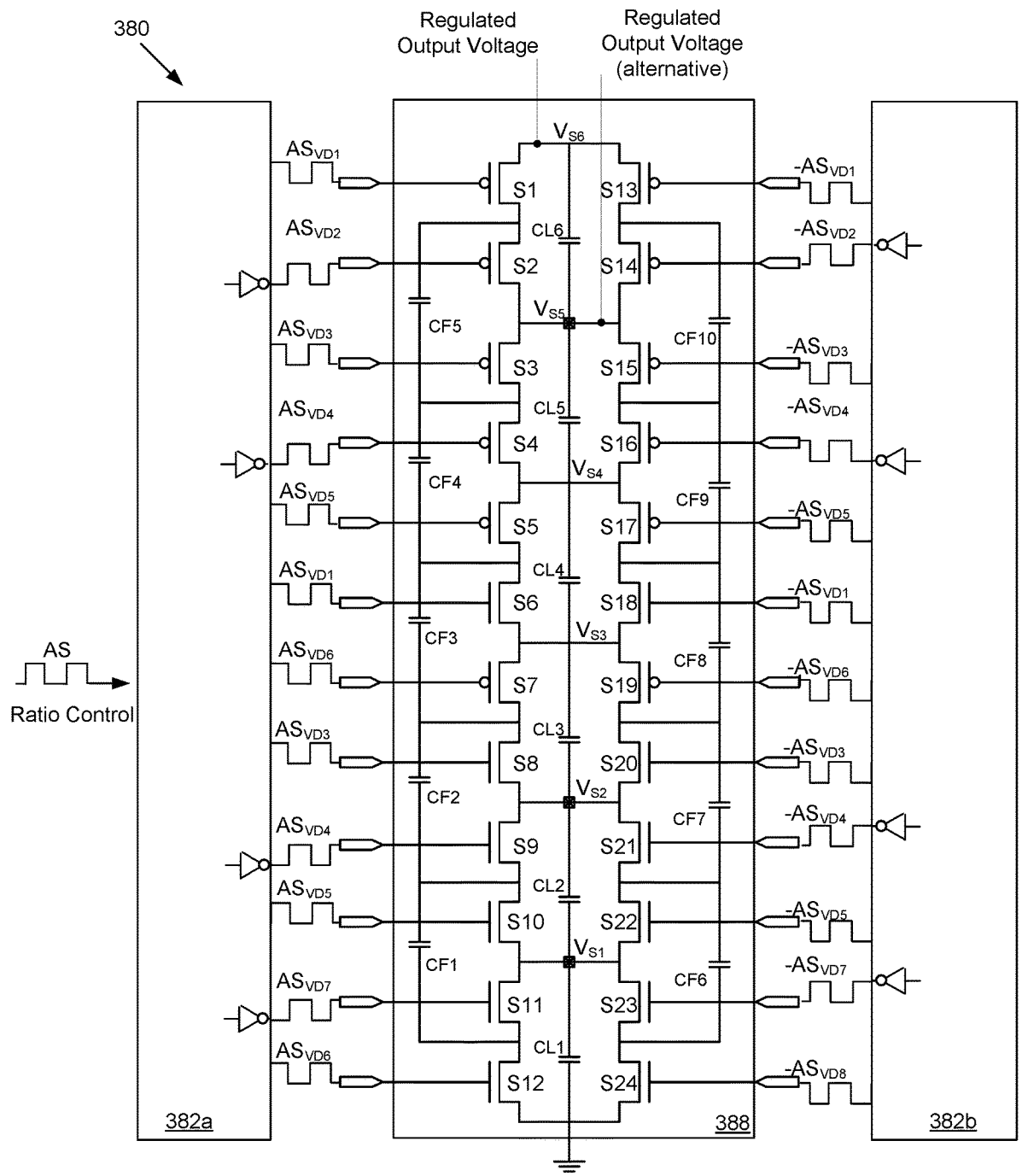
FIG. 3 illustrates an exemplary voltage splitter circuitry in accordance with various aspects described.

FIG. 3 illustrates an exemplary voltage splitter circuitry 380 that includes a ladder type charge pump 388 and a signal network 382a, 382b that supplies an actuator signal AS to switching devices S1-S24 in the ladder charge pump. The charge pump 388 includes six ladder capacitors CL1-CL6 which are kept at a desired charge level by switching devices S1-S24 selectively connecting the ladder capacitors to a network of flying capacitors CF1-CF10. The voltages $V_{S1}$-$V_{S6}$ generated by the charge pump 388 can be selectively switched to the power supply input of the power amplifier using a supply modulator (290 in FIG. 2).

The switching devices associated with each ladder capacitor are used to alternately connect or switch a flying capacitor to two ladder capacitors. Due to the different levels of charges on the various capacitors in the charge pump, the switching devices each operate in one of seven different voltage domains. The charge pump 388 is arranged in two symmetric halves so that each switching device has a corresponding switching device in the other half (e.g., S1 and S13) that is in the same voltage domain. All of the switching devices are controlled by the actuator signal in their respective voltage domain. In each pair of switching devices, one of the switching devices is controlled by the actuator signal while the other switching device is controlled by the actuator signal shifted 180 degrees in phase (e.g., $AS_{VD1}$ and $-AS_{VD1}$ for S1 and S13, respectively).

The actuator signals in the different voltage domains are generated by the signal network 382a, 382b (shown in two parts to simplify the illustration). The signal network receives the actuator signal AS in some source voltage domain and propagates the actuator signal amongst various level shifting branches to provide the actuator signal in the appropriate voltage domain to each of the switching devices S1-S24 in the charge pump. For optimal charge pump performance, the actuator signal in the different voltage domains should be synchronized so that all of the switching devices switch simultaneously. If the actuator signal in the different voltage domains is not synchronized the charge pump may experience "shoot through" in the switching devices that belong to non-overlapping pairs.

The power density of the actuator signal can be used to control the voltage levels of $V_{S1}$-$V_{S6}$ as a proportion of the regulated output voltage. Thus, the ratio control signal provided by the control circuitry (272 in FIG. 2) to the voltage splitter circuitry 380 can be in the form of an actuator signal having an appropriate power density or duty cycle.

Figure 4:
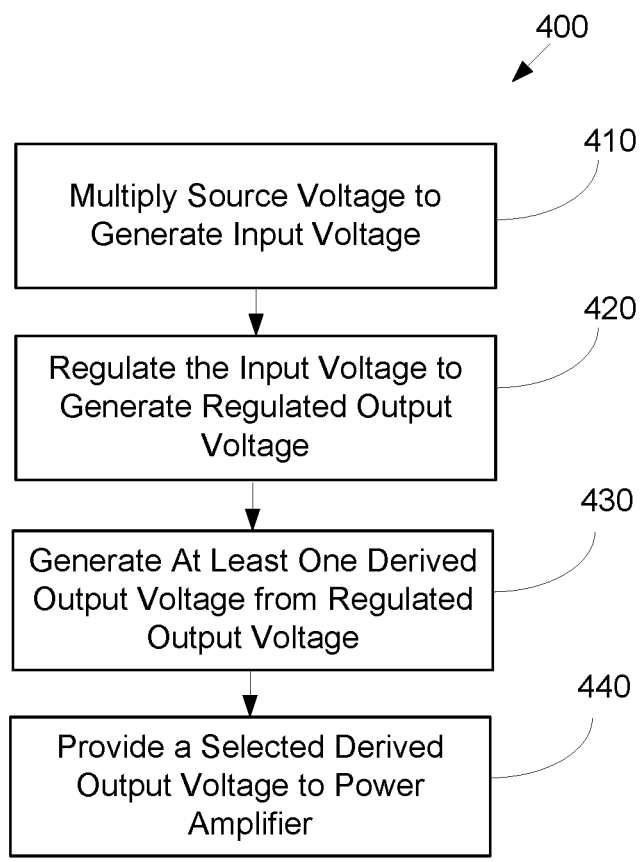
FIG. 4 illustrates a flow diagram outlining an exemplary method for generating a supply voltage for a power amplifier in accordance with various aspects described.

FIG. 4 illustrates a flow diagram outlining an exemplary method to generate a supply voltage for a power amplifier based on a target voltage. The method 400 may be performed, for example, by the voltage generation circuitry 270 of FIG. 2. The method includes, at 410, multiplying the source voltage to generate an input voltage having a voltage equal to or greater than the source voltage. At 420 the input voltage is regulated to generate a regulated output voltage having a voltage that is less than or equal to the input voltage. The method includes, at 430, generating at least one derived output voltage from the regulated output voltage. A selected one of the at least one derived output voltages is provided to the power amplifier at 440.

It can be seen from the foregoing description that the described voltage generation circuitry leverages the higher energy density of capacitors as compared to inductors to provide an overall board space advantage as well as resolving height limitations for the transmitter device. Further, the capacitive charge pump will operate at high efficiency because the capacitors' losses are reduced by the "inductive" load provided by the DC/DC buck converter.

Figure 5:
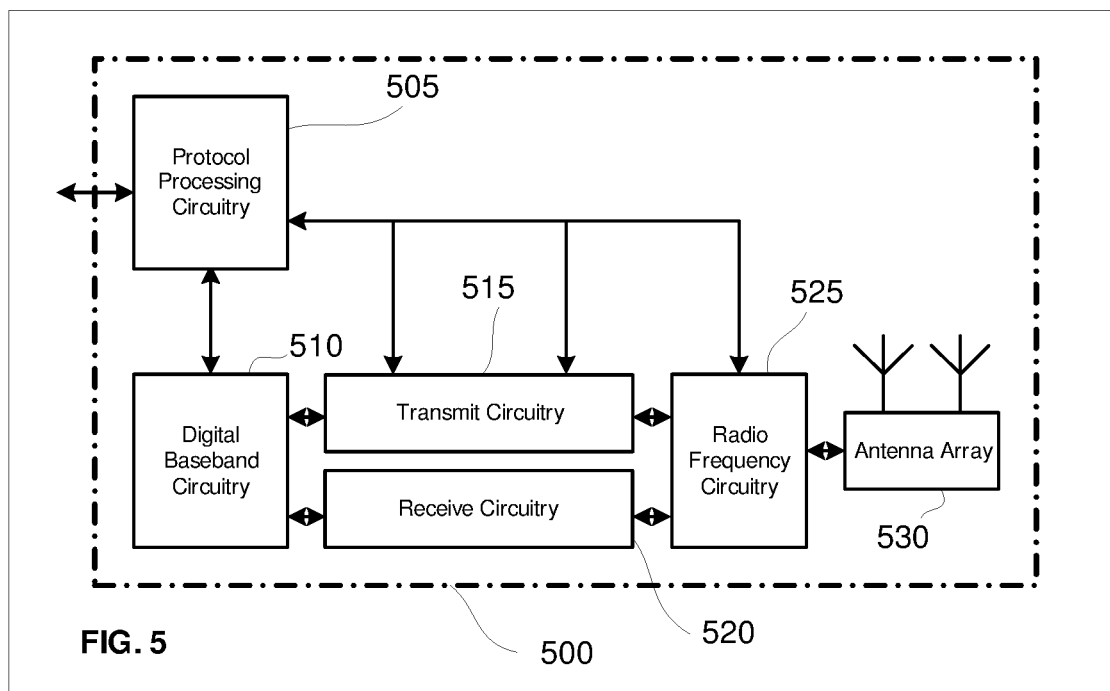
FIG. 5 illustrates an exemplary transceiver system in accordance with various aspects described.

FIG. 5 illustrates an exemplary millimeter wave communication circuitry 500 (e.g., transceiver) according to some aspects. Circuitry 500 is alternatively grouped according to functions. Components as shown in 500 are shown here for illustrative purposes and may include other components not shown here in FIG. 5.

Millimeter wave communication circuitry 500 may include protocol processing circuitry 505, which may implement one or more of medium access control (MAC), radio link control (RLC), packet data convergence protocol (PDCP), radio resource control (RRC) and non-access stratum (NAS) functions. Protocol processing circuitry 505 may include one or more processing cores (not shown) to execute instructions and one or more memory structures (not shown) to store program and data information.

Millimeter wave communication circuitry 500 may further include digital baseband circuitry 510, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 500 may further include transmit circuitry 515, receive circuitry 520 and/or antenna array circuitry 530. Millimeter wave communication circuitry 500 may further include radio frequency (RF) circuitry 525. In an aspect of the invention, RF circuitry 525 may include multiple parallel RF chains for one or more of transmit or receive functions, each connected to one or more antennas of the antenna array 530.

In an aspect of the disclosure, protocol processing circuitry 505 may include one or more instances of control circuitry (not shown) to provide control functions for one or more of digital baseband circuitry 510, transmit circuitry 515, receive circuitry 520, and/or radio frequency circuitry 525. Transmit circuitry 515 may include envelope tracking systems or perform envelope tracking methods according to the examples described herein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for generating supply voltages for a power amplifier according to embodiments and examples described herein.

Example 1 is a voltage generation circuitry configured to convert a source voltage into at least one derived output voltage for a power amplifier based on a target voltage. The voltage generation circuitry includes an adjustable boost circuitry configured to multiply the source voltage to generate an input voltage having a voltage equal to or greater than the source voltage; a step-down regulator circuitry configured to regulate the input voltage to generate a regulated output voltage having a voltage that is less than or equal to the input voltage; and a voltage splitter circuitry coupled to the regulated output voltage and configured to generate the at least one derived output voltage from the regulated output voltage.

Example 2 includes the subject matter of example 1, including or omitting optional elements, wherein the adjustable boost circuitry includes a capacitor-based adjustable charge pump that multiplies a charge level of the source voltage by a boost factor to generate the input voltage.

Example 3 includes the subject matter of example 1, including or omitting optional elements, wherein the adjustable boost circuitry is configured to operate in a bypass mode when the target voltage is less than or equal to the source voltage such that the source voltage is input to the step-down regulator circuitry as the input voltage.

Example 4 includes the subject matter of example 1, including or omitting optional elements, wherein the step-down regulator circuitry includes an inductor-based direct current/direct current (DC/DC) buck converter.

Example 5 includes the subject matter of example 1, including or omitting optional elements, wherein the voltage splitter circuitry includes a charge pump coupled to the regulated output voltage and configured to generate the at least one derived output voltage from the regulated output voltage.

Example 6 includes the subject matter of example 1, including or omitting optional elements, wherein the voltage generation circuitry further includes control circuitry configured to determine the target voltage; select a boost factor for the adjustable boost circuitry based on the target voltage and the source voltage; and generate control signals for the step-down regulator circuitry based on a difference between a voltage feedback signal and the target voltage.

Example 7 includes the subject matter of example 6, including or omitting optional elements, wherein the control circuitry is configured to determine a ratio between the regulated output voltage and the at least one derived output voltage based on the target voltage and provide a ratio control signal to the voltage splitter circuitry to control the voltage splitter circuitry to generate the derived output voltages according to the ratio.

Example 8 includes the subject matter of example 1, including or omitting optional elements, further including envelope circuitry configured to determine the target voltage based on future values of an envelope of a radio frequency (RF) signal that is amplified by the power amplifier.

Example 9 is a method to generate at least one derived output voltage for a power amplifier based on a target voltage. The method includes multiplying a source voltage by a boost factor to generate an input voltage having a voltage equal to or greater than the source voltage; regulating the input voltage to generate a regulated output voltage having a voltage that is less than or equal to the input voltage; generating at least one derived output voltage from the regulated output voltage; and providing a selected one of the at least one derived output voltage to the power amplifier.

Example 10 includes the subject matter of example 9, including or omitting optional elements, including multiplying the source voltage using a capacitor-based adjustable charge pump that multiplies a charge level of the source voltage by boost factor to generate the input voltage.

Example 11 includes the subject matter of example 10, including or omitting optional elements, including operating the adjustable charge pump in a bypass mode when the target voltage is less than or equal to the source voltage.

Example 12 includes the subject matter of example 9, including or omitting optional elements, including regulating the input voltage with an inductor-based direct current/direct current (DC/DC) buck converter.

Example 13 includes the subject matter of example 9, including or omitting optional elements, further including determining the target voltage; selecting the boost factor based on the target voltage and the source voltage; and regulating the input voltage based on a difference between a voltage feedback signal and the target voltage.

Example 14 includes the subject matter of example 13, including or omitting optional elements, further including determining a ratio between the regulated output voltage and the at least one derived output voltage based on the target voltage and generating the derived output voltages according to the ratio.

Example 15 includes the subject matter of example 9, including or omitting optional elements, further including determining the target voltage based on future values of an envelope of a radio frequency (RF) signal that is amplified by the power amplifier.

Example 16 is a transmitter, including a power amplifier that is powered by a supply voltage and amplifies an RF signal for transmission by the transmitter; an envelope tracking circuitry configured to determine a target voltage for the supply voltage based on the RF signal; an adjustable boost circuitry configured to multiply a source voltage to generate an input voltage having a voltage equal to or greater than the source voltage; a step-down regulator circuitry configured to regulate the input voltage to generate a regulated output voltage having a voltage that is less than or equal to the input voltage; a voltage splitter circuitry coupled to the regulated output voltage and configured to generate at least one derived output voltage from the regulated output voltage; and a supply modulator configured to provide a selected one of the at least one derived output voltage to the power amplifier.

Example 17 includes the subject matter of example 16, including or omitting optional elements, wherein the adjustable boost circuitry includes a capacitor-based adjustable charge pump that multiplies a charge level of the source voltage by a boost factor to generate the input voltage.

Example 18 includes the subject matter of example 16, including or omitting optional elements, wherein the adjustable boost circuitry is configured to operate in a bypass mode when the target voltage is less than or equal to the source voltage such that the source voltage is input to the step-down regulator circuitry as the input voltage.

Example 19 includes the subject matter of example 16, including or omitting optional elements, wherein the step-down regulator circuitry includes an inductor-based direct current/direct current (DC/DC) buck converter.

Example 20 includes the subject matter of example 16, including or omitting optional elements, wherein the voltage splitter circuitry includes a charge pump coupled to the regulated output voltage and configured to generate the at least one derived output voltage from the regulated output voltage.

Example 21 includes the subject matter of example 16, including or omitting optional elements, further including control circuitry configured to determine the target voltage; select a boost factor for the adjustable boost circuitry based on the target voltage and the source voltage; and generate control signals for the step-down regulator circuitry based on a difference between a voltage feedback signal and the target voltage.

Example 22 includes the subject matter of example 21, including or omitting optional elements, wherein the control circuitry is configured to determine a ratio between the regulated output voltage and the at least one derived output voltage based on the target voltage and provide a ratio control signal to the voltage splitter circuitry to control the voltage splitter circuitry to generate the derived output voltages according to the ratio.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A voltage generation circuitry configured to convert a source voltage into at least one derived output voltage for a power amplifier based on a target voltage, the voltage generation circuitry comprising:
   an adjustable boost circuitry configured to multiply the source voltage to generate an input voltage having a voltage equal to or greater than the source voltage;
   a step-down regulator circuitry configured to regulate the input voltage to generate a regulated output voltage having a voltage that is less than or equal to the input voltage; and
   a voltage splitter circuitry coupled to the regulated output voltage and configured to generate the at least one derived output voltage from the regulated output voltage.

2. The voltage generation circuitry of claim 1, wherein the adjustable boost circuitry comprises a capacitor-based adjustable charge pump that multiplies a charge level of the source voltage by a boost factor to generate the input voltage.

3. The voltage generation circuitry of claim 1, wherein the adjustable boost circuitry is configured to operate in a bypass mode when the target voltage is less than or equal to the source voltage such that the source voltage is input to the step-down regulator circuitry as the input voltage.

4. The voltage generation circuitry of claim 1, wherein the step-down regulator circuitry comprises an inductor-based direct current/direct current (DC/DC) buck converter.

5. The voltage generation circuitry of claim 1, wherein the voltage splitter circuitry comprises a charge pump coupled to the regulated output voltage and configured to generate the at least one derived output voltage from the regulated output voltage.

6. The voltage generation circuitry of claim 1, wherein the voltage generation circuitry further comprises control circuitry configured to:
   determine the target voltage;
   select a boost factor for the adjustable boost circuitry based on the target voltage and the source voltage; and
   generate control signals for the step-down regulator circuitry based on a difference between a voltage feedback signal and the target voltage.

7. The voltage generation circuitry of claim 6, wherein the control circuitry is configured to:

determine a ratio between the regulated output voltage and the at least one derived output voltage based on the target voltage; and provide a ratio control signal to the voltage splitter circuitry to control the voltage splitter circuitry to generate the derived output voltages according to the ratio.

8. The voltage generation circuitry of claim 1, further comprising envelope circuitry configured to determine the target voltage based on future values of an envelope of a radio frequency (RF) signal that is amplified by the power amplifier.

9. A method to generate at least one derived output voltage for a power amplifier based on a target voltage, the method comprising:

multiplying a source voltage by a boost factor to generate an input voltage having a voltage equal to or greater than the source voltage;

regulating the input voltage to generate a regulated output voltage having a voltage that is less than or equal to the input voltage;

generating at least one derived output voltage from the regulated output voltage; and providing a selected one of the at least one derived output voltage to the power amplifier.

10. The method of claim 9, comprising multiplying the source voltage using a capacitor-based adjustable charge pump that multiplies a charge level of the source voltage by boost factor to generate the input voltage.

11. The method of claim 10, comprising operating the adjustable charge pump in a bypass mode when the target voltage is less than or equal to the source voltage.

12. The method of claim 9, comprising regulating the input voltage with an inductor-based direct current/direct current (DC/DC) buck converter.

13. The method of claim 9, further comprising:
determining the target voltage;
selecting the boost factor based on the target voltage and the source voltage; and
regulating the input voltage based on a difference between a voltage feedback signal and the target voltage.

14. The method of claim 13, further comprising:
determining a ratio between the regulated output voltage and the at least one derived output voltage based on the target voltage; and
generating the derived output voltages according to the ratio.

15. The method of claim 9, further comprising determining the target voltage based on future values of an envelope of a radio frequency (RF) signal that is amplified by the power amplifier.

16. A transmitter, comprising:
a power amplifier that is powered by a supply voltage and amplifies an RF signal for transmission by the transmitter;
an envelope tracking circuitry configured to determine a target voltage for the supply voltage based on the RF signal;
an adjustable boost circuitry configured to multiply a source voltage to generate an input voltage having a voltage equal to or greater than the source voltage;
a step-down regulator circuitry configured to regulate the input voltage to generate a regulated output voltage having a voltage that is less than or equal to the input voltage;
a voltage splitter circuitry coupled to the regulated output voltage and configured to generate at least one derived output voltage from the regulated output voltage; and
a supply modulator configured to provide a selected one of the at least one derived output voltage to the power amplifier.

17. The transmitter of claim 16, wherein the adjustable boost circuitry comprises a capacitor-based adjustable charge pump that multiplies a charge level of the source voltage by a boost factor to generate the input voltage.

18. The transmitter of claim 16, wherein the adjustable boost circuitry is configured to operate in a bypass mode when the target voltage is less than or equal to the source voltage such that the source voltage is input to the step-down regulator circuitry as the input voltage.

19. The transmitter of claim 16, wherein the step-down regulator circuitry comprises an inductor-based direct current/direct current (DC/DC) buck converter.

20. The transmitter of claim 16, wherein the voltage splitter circuitry comprises a charge pump coupled to the regulated output voltage and configured to generate the at least one derived output voltage from the regulated output voltage.

21. The transmitter of claim 16, further comprising control circuitry configured to:
determine the target voltage;
select a boost factor for the adjustable boost circuitry based on the target voltage and the source voltage; and
generate control signals for the step-down regulator circuitry based on a difference between a voltage feedback signal and the target voltage.

22. The transmitter of claim 21, wherein the control circuitry is configured to:
determine a ratio between the regulated output voltage and the at least one derived output voltage based on the target voltage; and
provide a ratio control signal to the voltage splitter circuitry to control the voltage splitter circuitry to generate the derived output voltages according to the ratio.

* * * * *